US011732074B2

(12) United States Patent
Rogojina et al.

(10) Patent No.: US 11,732,074 B2
(45) Date of Patent: Aug. 22, 2023

(54) COMPOSITIONS AND TECHNIQUES FOR FORMING ORGANIC THIN FILMS

(71) Applicant: KATEEVA, INC., Newark, CA (US)

(72) Inventors: Elena Rogojina, Newark, CA (US); Inna Gurevitch, Newark, CA (US); Teresa A. Ramos, Newark, CA (US); Lorenza Moro, Newark, CA (US); Victor Miranda, Newark, CA (US)

(73) Assignee: Kateeva, Inc., Newark, CA (US)

( * ) Notice: Subject to any disclaimer, the term of this patent is extended or adjusted under 35 U.S.C. 154(b) by 289 days.

(21) Appl. No.: 16/765,554

(22) PCT Filed: Feb. 20, 2019

(86) PCT No.: PCT/US2019/018761

§ 371 (c)(1),
(2) Date: May 20, 2020

(87) PCT Pub. No.: WO2019/182710

PCT Pub. Date: Sep. 26, 2019

(65) Prior Publication Data

US 2020/0308329 A1 Oct. 1, 2020

Related U.S. Application Data

(60) Provisional application No. 62/659,493, filed on Apr. 18, 2018, provisional application No. 62/647,470, filed on Mar. 23, 2018.

(51) Int. Cl.

*C08F 222/10* (2006.01)
*C08F 220/18* (2006.01)
(Continued)

(52) U.S. Cl.
CPC ............ *C08F 222/102* (2020.02); *C08F 2/38* (2013.01); *C08F 220/1812* (2020.02);
(Continued)

(58) Field of Classification Search
CPC .. C08F 222/102; C08F 2/38; C08F 220/1812; C08F 222/103; C08F 2800/10;
(Continued)

(56) References Cited

U.S. PATENT DOCUMENTS 5,869,564 A 2/1999 Beach et al.
7,767,498 B2 8/2010 Moro et al.
(Continued)

FOREIGN PATENT DOCUMENTS

CN 1835987 A 9/2006
CN 103547639 A 1/2014
(Continued)

OTHER PUBLICATIONS

Kinoshita et al., machine English translation of JP 2014-168948 (Year: 2014).*
(Continued)

*Primary Examiner* — Jessica M Roswell
(74) *Attorney, Agent, or Firm* — Hauptman Ham, LLP

(57) ABSTRACT

The present teachings relate to various embodiments of a curable ink composition, which once printed and cured form polymeric films on a substrate such as, but not limited by, an OLED device substrate. Various embodiments of the curable ink compositions comprise di(meth)acrylate monomers, as well as multifunctional crosslinking agents and curing kinetics control additives.

19 Claims, 7 Drawing Sheets

(51) Int. Cl.

| | |
|---|---|
| ***C08F 2/38*** | (2006.01) |
| ***C08K 5/00*** | (2006.01) |
| ***C08L 25/06*** | (2006.01) |
| ***C08K 5/37*** | (2006.01) |
| ***C08K 5/5425*** | (2006.01) |
| ***C08K 5/5435*** | (2006.01) |
| ***C09D 11/101*** | (2014.01) |
| ***C09D 11/107*** | (2014.01) |
| ***H10K 50/844*** | (2023.01) |

(52) U.S. Cl.
CPC ........ *C08F 222/103* (2020.02); *C08K 5/0025* (2013.01); *C08K 5/37* (2013.01); *C08K 5/5425* (2013.01); *C08K 5/5435* (2013.01); *C08L 25/06* (2013.01); *C09D 11/101* (2013.01); *C09D 11/107* (2013.01); *H10K 50/844* (2023.02); *C08F 2800/10* (2013.01); *C08L 2203/16* (2013.01); *C08L 2203/206* (2013.01)

(58) Field of Classification Search
CPC .. C08F 2/50; C08F 2/44; C08F 220/10; C08F 230/08; C08K 5/0025; C08K 5/37; C08K 5/5428; C08K 5/5435; C08L 25/06; C09D 11/101; C09D 11/106; C09D 4/00; C09D 11/30; H01L 51/5253; H01L 51/56
See application file for complete search history.

(56) References Cited

U.S. PATENT DOCUMENTS

| | | | | |
|---|---|---|---|---|
| 9,598,582 | B2 | 3/2017 | Nam et al. | |
| 9,893,307 | B2 | 2/2018 | Nam et al. | |
| 10,233,350 | B2 | 3/2019 | Lee et al. | |
| 10,392,459 | B2 | 8/2019 | Kwon et al. | |
| 10,727,443 | B2 | 7/2020 | Kim et al. | |
| 2006/0258828 | A1 | 11/2006 | Sugawara et al. | |
| 2007/0268556 | A1* | 11/2007 | Chopra | G02F 1/16757 359/296 |
| 2010/0099318 | A1* | 4/2010 | Suzuki | C09J 133/08 442/151 |
| 2011/0237766 | A1 | 9/2011 | Maggio et al. | |
| 2013/0335479 | A1 | 12/2013 | Takabayashi et al. | |
| 2015/0179976 | A1* | 6/2015 | Galand | C08K 3/22 522/39 |
| 2015/0337065 | A1 | 11/2015 | Nam et al. | |
| 2016/0072098 | A1 | 3/2016 | Lee et al. | |
| 2016/0137857 | A1 | 5/2016 | Zhang et al. | |
| 2017/0062762 | A1 | 3/2017 | Jain et al. | |

FOREIGN PATENT DOCUMENTS

| | | | | |
|---|---|---|---|---|
| CN | 104704035 | A | 6/2015 | |
| JP | 2014-168948 | A * | 9/2014 | B32B 27/00 |
| WO | WO-2016098314 | A1 * | 6/2016 | C08G 75/0222 |
| WO | 2017213664 | A1 | 12/2017 | |

OTHER PUBLICATIONS

International Search Report dated Jun. 18, 2019 for International Patent Application No. PCT/US19/18761.
CN Office Action dated Apr. 1, 2022 for CN Patent Application No. 201980021504.2.
Second Office Action dated Oct. 18, 2022 for CN Patent Application No. 201980021504.2.

* cited by examiner

COMPOSITIONS AND TECHNIQUES FOR FORMING ORGANIC THIN FILMS

CROSS-REFERENCE TO RELATED APPLICATIONS

This application is a National Stage of International Application No. PCT/US19/18761, filed Feb. 20, 2019, which claims the benefit of U.S. Patent Application No. 62/647,470, filed Mar. 23, 2018, and U.S. provisional patent application No. 62/659,493, filed Apr. 18, 2018, the contents of which are herein incorporated by reference.

OVERVIEW

Interest in the potential of organic light-emitting diode (OLED) optoelectronic device technology, such as OLED display and OLED lighting devices, has been driven by OLED technology attributes that include demonstration of devices that have highly saturated colors and provide high-contrast, and are ultrathin, fast-responding, and energy efficient.

Various OLED optoelectronic devices are fabricated from inorganic and organic materials, including various organic thin film emissive materials. Such materials can be susceptible to degradation by water, oxygen and other chemical species in the environment. To address this, OLED devices have been encapsulated in order to provide protection against degradation. For example, encapsulation stacks that include alternating inorganic barrier layers and organic planarizing layers have been used to isolate the moisture- and/or oxygen-sensitive materials in OLEDs.

Though various manufacturing methods can be used for the deposition of the planarizing layer in an encapsulation stack, inkjet printing can provide several advantages. First, a range of vacuum processing operations can be eliminated because inkjet-based fabrication can be performed at atmospheric pressure. Additionally, during an inkjet printing process, an organic planarizing layer can be localized to cover portions of an OLED substrate over and proximal to an active region, to effectively encase an active region, including lateral edges of the active region. The targeted patterning using inkjet printing results in eliminating material waste, as well as eliminating the need for masks and therefore challenges presented with the alignment and fouling thereof, as well as eliminating additional processing typically required to achieve patterning of an organic layer when utilizing, for example, various vapor deposition processes.

Accordingly, various compositions of the present teachings can be deposited on a substrate and cured to form an organic layer on a substrate. In various methods of the present teachings, inkjet deposition can be used for the deposition of an organic thin film composition on a substrate, followed by a curing process to form an organic layer on a substrate.

BRIEF DESCRIPTION OF THE DRAWINGS

A better understanding of the features and advantages of the present disclosure will be obtained by reference to the accompanying drawings, which are intended to illustrate, not limit, the present teachings.

DETAILED DESCRIPTION OF THE DISCLOSURE

Figure 1:
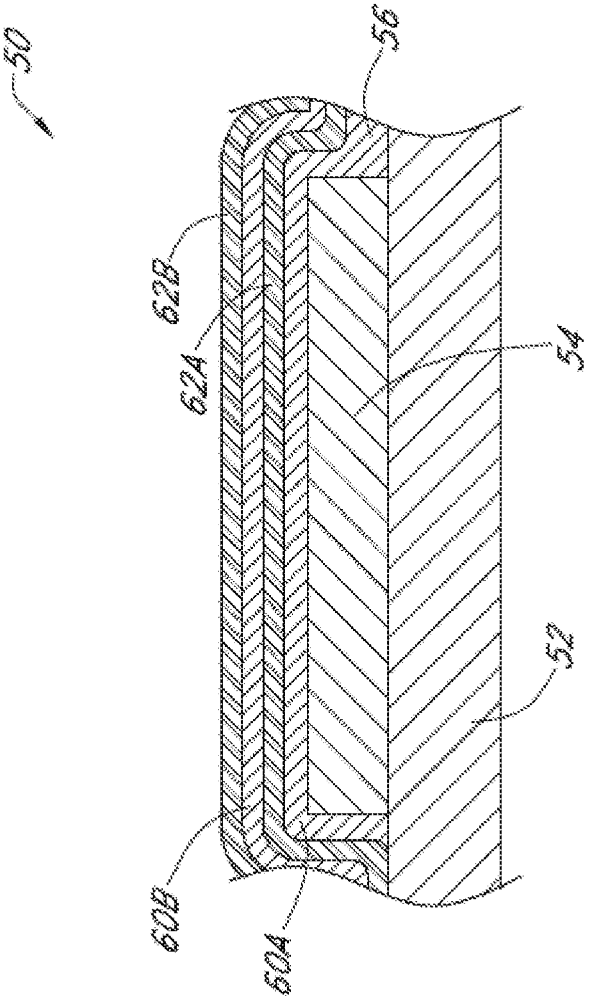
FIG. 1 is a schematic section view of an optoelectronic device, illustrating various aspects of a fabrication.

The present teachings relate to various embodiments of curable ink compositions, which once deposited and cured, provide a polymeric film over at least a portion of a substrate in an electronic device.

Electronic devices on which the polymeric films may be formed include electronic devices having one or more components that are moisture- and/or oxygen-sensitive—that is, one or more components whose performance is negatively affected by reactions with water and/or oxygen in the atmosphere. In such devices, the polymeric film may be included as a planarizing layer in a multi-layered encapsulation stack, as described in greater detail below. The polymeric films may also be used to improve light extraction for a light-emitting optoelectronic device, to provide thermal dissipation for a heat-generating device, and/or to provide protection from mechanical damage for an electronic device that is susceptible to breaking, including electronic devices that have glass components, such as glass screens. Electronic devices over which the polymeric films can be formed include optoelectronic devices, such as OLEDs, as well as lithium batteries, capacitors, and touch screen devices. Because the polymeric films are flexible, they are suited for use with flexible electronic devices.

In some embodiments of the encapsulated devices, the polymeric films are disposed over a light-emitting active region of an OLED device substrate. The light-emitting active region of an OLED device can include various materials that degrade in the presence of exposure to various reactive species, such as, but not limited by, water vapor, oxygen, and various solvent vapors from device processing. Such degradation can impact the stability and reliability of an OLED device. In order to prevent such degradation, a multilayered encapsulation stack can be used to protect the OLED, wherein the encapsulation stack includes a film of an inorganic barrier layer adjacent to a polymeric planarizing layer. An encapsulation stack will include at least one such inorganic barrier layer/polymeric planarizing layer pair ("dyad"), but can include multiple stacked dyads. Moreover, the lowermost layer in the encapsulation stack, which is in contact with at least one substrate of the electronic device, can be either an inorganic barrier layer or a polymeric planarizing layer. Thus, a polymeric film that is disposed over a light-emitting active region need not be formed directly on the light-emitting active region. For example, the polymeric film can be formed on one of the electrodes between which the light-emitting active region is disposed, on an inorganic barrier layer that forms part of an encapsulation stack, and/or on the surface of an OLED support substrate.

Regarding the various deposition techniques that can be used to apply the curable ink compositions, an industrial inkjet printing system that can be housed in an enclosure configured to provide a controlled process environment can be used. Inkjet printing for the deposition of the curable ink compositions described herein can have several advantages. First, a range of vacuum processing operations can be eliminated, as inkjet-based fabrication can be performed at atmospheric pressure. Additionally, during an inkjet printing process, an ink composition can be localized to cover portions of an electronic device substrate, including portions that are over and proximal to an active region, to effectively encapsulate an active region, including the lateral edges of the active region. The targeted patterning using inkjet printing results in eliminating material waste, as well as eliminating additional processing typically required to achieve patterning of an organic layer, as required, for example, by various masking techniques.

Various embodiments of the curable ink compositions of the present teachings can be deposited by printing over a wide number of OLED devices, such as OLED display devices and OLED lighting devices, to form a uniform planarizing layer. Such ink compositions can be cured using thermal processing (e.g. bake), by exposure to optical energy, (e.g., UV cure or infrared (IR) cure), or electron-beam curing. Some embodiments of the ink compositions can be cured by UV radiation, including UV radiation in the wavelength range of between about 365 nm to about 420 nm.

Regarding encapsulation stacks fabricated over an active region of an electronic device, as depicted in the schematic section view of FIG. 1, electronic device 50 can be fabricated on substrate 52. Various embodiments of a substrate can include a thin silica-based glass, as well as any of a number of flexible polymeric materials. For example, substrate 52 can be transparent, such as for use in a bottom-emitting optoelectronic device (e.g. OLED) configuration. One or more layers associated with an electronic device stack, such as various organic or other material can be deposited, inkjet printed, or otherwise formed upon the substrate to provide an active region 54, such as an electroluminescent region in an OLED. Note that active region 54 in FIG. 1 is illustrated schematically as a single block, but can in detail further include a region having complex topology or structure with multiple discrete devices and film layers. In an example, if electronic device 50 is an OLED device, in can include an emissive layer, or other layers, coupled to an anode electrode and a cathode electrode. An anode electrode or a cathode electrode can be coupled to or can include electrode portion 56 that is laterally offset along the substrate 52 from the active region 54.

As depicted in the illustrative embodiment of FIG. 1, an inorganic barrier layer 60A can be provided on electronic device 50 over active region 54. For example, the inorganic barrier layer can be blanket coated (e.g., deposited) over an entirety, or substantially an entirety of a surface of the substrate 52, including active region 54, using, by way of a non-limiting example, plasma enhanced chemical vapor deposition (PECVD). Examples of inorganic materials useful for fabricating inorganic barrier layer 60A can include various inorganic oxides, such as one or more of $Al_2O_3$, $TiO_2$, $HfO_2$, $SiO_xN_y$, inorganic nitrides, or one or more other materials. Adjacent to inorganic barrier layer 60A is polymeric film 62A. As previously discussed herein, polymeric film 62A can be deposited using for example, inkjet printing of a curable ink composition and then curing the ink composition to form the polymeric film. Polymeric film 62A can serve as a planarizing layer to planarize and mechanically protect the active region 54, as part of an encapsulation stack that collectively serves to suppress or inhibit moisture or gas permeation into the active region 54. FIG. 1 illustrates generally a multilayered encapsulation stack configuration having inorganic barrier layer 60A polymeric film 62A, a second inorganic barrier layer 60B, and a second polymeric film 62B. Without being bound by theory or explanation, the planarizing layers in an encapsulation stack can serve to prevent the propagation of defects from one inorganic barrier layer into an adjacent inorganic barrier layer. As such, various embodiments of encapsulation stacks can be created to provide the mechanical and sealing properties desired for an electronic device. The order of the fabrication of the layers in the encapsulation stack depicted in FIG. 1 could be reversed, so that a polymeric planarizing layer is first fabricated, followed by the fabrication of an inorganic barrier layer. Additionally, greater or fewer numbers of dyads can be present. For example, a stack having inorganic barrier layers 60A and 60B as shown, and a single polymeric planarizing layer 62A can be fabricated.

As will be discussed in more detail herein, the present inventors have recognized the need for curable ink compositions that that can be used to form polymeric films that remain stable throughout the electronic device fabrication processes, as well as providing long-term stability and function as part of a protective layer for various electronic devices.

Curable Ink Compositions for Thin Film Formation

Curable ink compositions of the present teachings can be readily deposited as a liquid material on a substrate and then cured to form a polymeric thin film thereupon. Such curable ink compositions can include diacrylate monomers, dimethacrylate monomers, monoacrylate monomers, monomethacrylate monomers, and combinations thereof, as well as various multifunctional crosslinking agents. As used herein, the phrase "(meth)acrylate" indicates that the recited component may be an acrylate, methacrylate, or combinations thereof. For example, the term "(meth)acrylate monomer" refers to both methacrylate monomers and acrylate monomers. Various embodiments of the curable ink compositions further include curing kinetics control additives and/or cure initiators.

The compositions described herein are referred to as "ink compositions" because various embodiments of the compositions can be applied using techniques, including printing techniques, by which conventional inks have been applied to substrates. Such printing techniques include, for example, inkjet printing, screen printing, thermal transfer printing, flexographic printing, and/or offset printing. However, various embodiments of the ink compositions can also be applied using other coating techniques, such as, for example, spray coating, spin coating, and the like. Moreover, the ink compositions need not contain colorants, such as dyes and pigments, which are present in some conventional ink compositions.

Some of the deposition techniques by which the ink compositions can be applied include precision deposition techniques. Precision deposition techniques are techniques that apply the ink compositions to a substrate with a high degree of precision and accuracy with respect to the quantity, location, shape, and/or dimensions of the printed ink compositions and the cured polymeric films that are formed therefrom. The precision deposition techniques are able to form blanket coatings of the ink compositions or patterned coatings of the ink compositions that, once cured, form thin polymeric films with highly uniform thicknesses and well-defined edges. As a result, the precision deposition coating techniques are able to provide thin polymeric films that meet the requirements of a variety of organic electronic and organic optoelectronic device applications. The required quantity, location, shape, and dimensions for a given precision deposited ink composition and the cured film formed therefrom, will depend on the intended device application. By way of illustration, various embodiments of the precision deposition techniques are able to form blanket or patterned films having a thickness of no greater than 10 μm with a thickness variation of no more than 5% across the film. Inkjet printing in one example of a precision deposition technique.

The ink compositions include at least one (meth)acrylate-based monomer, at least one multifunctional crosslinking agent, and at least one cure initiator. Optionally, the ink compositions may further include at least one curing kinetics control additive, at least one monofunctional (meth)acrylate (also referred to as a mono(meth)acrylate), or both.

Various embodiments of the ink compositions can be formed into cured films using a variety of methods, including spin coating, spraying, and inkjet printing. Cured polymeric films made from the ink compositions are stable and flexible. In addition, the ink compositions can be formulated to provide cured polymeric films with glass transition temperatures ($T_g$) that allow them to be subjected to various post-processing techniques. Having a sufficiently high $T_g$ is desirable for certain applications, such as applications where the polymeric films are exposed to high temperature conditions. By way of illustration, for some electronic devices, including OLEDs, is it standard practice to test the stability of the devices by subjecting them to accelerated reliability testing in which the polymeric film would be exposed to high humidity under elevated temperatures. For example, the devices may be subjected to testing at 60° C. and 90% relative humidity (RH) or at 85° C. and 85% RH. Additionally, the $T_g$ of the polymeric films should be sufficiently high to withstand any high temperature post-processing steps that are used to fabricate the electronic devices into which they are incorporated. For example, if a layer of material, such as an inorganic barrier layer, is deposited over the polymeric film the polymeric film should be stable enough to withstand the maximum deposition temperature for the inorganic material. By way of illustration, inorganic barrier layers can be deposited over polymeric planarizing layers using plasma enhanced chemical vapor deposition (PECVD), which can require deposition temperatures of 80° C. or higher. In order to pass the tests or withstand the post-processing, the polymeric film should have a $T_g$ that is higher than the testing or processing temperatures. For high temperature applications such as these, the curable ink compositions can be formulated to provide a $T_g$ of 80° C. or greater. This includes embodiments of ink compositions that are formulated to provide a $T_g$ of 85° C. or greater.

Some embodiments of the curable ink compositions include a di(meth)acrylate monomer, such as an alkyl di(meth)acrylate monomer, where the generalized structure of an alkyl di(meth)acrylate is given by:

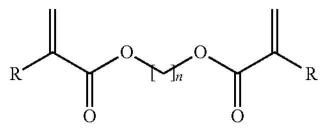

where n is 3 to 21 and R is H or $CH_3$.

For various embodiments of curable ink compositions of the present teachings, the alkyl chain of an alkyl di(meth) acrylate monomer can have between 3 to 21 carbon atoms and in various compositions, moreover between 3 to 14 carbon atoms. Various embodiments of curable ink compositions of the present teachings can utilize an alkyl di(meth) acrylate monomer that can have an alkyl chain with between 6 to 12 carbon atoms. As will be discussed subsequently in more detail herein, factors that can guide the selection of an alkyl di(meth)acrylate monomer can include the resulting viscosity of a formulation at a selected deposition temperature, as well as falling within the range of a target surface tension.

An exemplary alkyl di(meth)acrylate monomer according to the present teachings is 1, 12 dodecanediol dimethacrylate, having the structure as shown below:

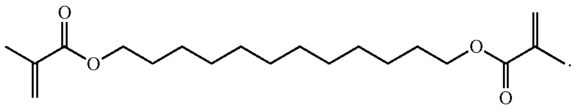 [SMILES: C=C(C)C(=O)OCCCCCCCCCCCCOC(=O)C(=C)C]

Various embodiments of curable ink compositions of the present teachings can include between about 57 mol. % to about 97 mol. % of an alkyl di(meth)acrylate monomer, such as 1, 12 dodecanediol dimethacrylate (DDMA) monomer, and further can include curable ink compositions that comprise about 71 mol. % to 93 mol. % of an alkyl di(meth) acrylate monomer. However, other embodiments of the curable ink compositions have a dimethacrylate monomer concentration of less than 60 mol. %. This includes embodiments of the curable ink compositions having a dimethacrylate monomer concentration of no greater than 56 mol. %. By way of illustration, some embodiments of the ink compositions have a dimethacrylate concentration, for example, a DDMA concentration, in the range from 50 mol. % to 56 mol. %. These lower dimethacrylate monomer concentrations can be used, for example, in ink compositions that have a substantial concentration of diacrylate monomers, as discussed in more detail below.

In addition to an alkyl di(meth)acrylate monomer, the curable ink compositions of the present teachings can have a diurethane di(meth)acrylate monomer component in the in the formulation. A generalized diurethane di(meth)acrylate monomer structure is given by:

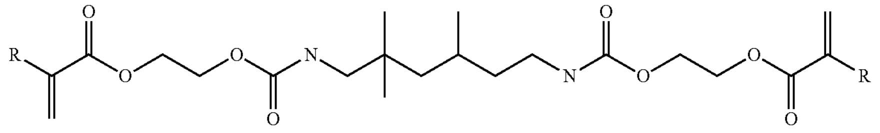

where R is independently selected from H and $CH_3$

An exemplary diurethane di(meth)acrylate monomer according to the present teachings is diurethane dimethacrylate (DUDMA), having the generalized structure as shown below, can be included in curable ink compositions of the present teachings:

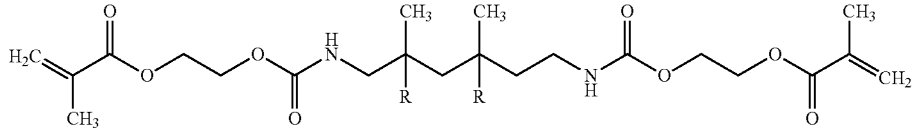

R = H or $CH_3$ (~1:1)

where DUDMA can be a mixture of isomers in which R can be hydrogen (H) or methyl ($CH_3$) in essentially equal proportion. For various embodiments of curable ink compositions of the present teachings, DUDMA can be between about 1 mol. % to about 20 mol. % of a composition.

In addition to, or instead of, dimethacrylate monomers, such as DDMA, the curable ink compositions can include one or more diacrylate monomers. The inclusion of diacrylate monomers, which lack the pendant methyl group of a dimethacrylate, can increase the elastic modulus of the cured polymeric films made from the curable ink compositions, relative to polymeric films made from curable ink compositions that lack the diacrylate monomers. Therefore, ink composition that include diacrylates are suited for forming polymeric films on flexible electronic devices. In particular, polymeric film flexibility can be increased by alkyl diacrylate monomers having long linear alkyl chains. By way of illustration, the alkyl chain of an alkyl diacrylate monomer can have 3 to 21 carbon atoms and in various compositions, moreover between 3 to 14 carbon atoms. For example, embodiments of curable ink compositions of the present teachings can utilize an alkyl diacrylate monomer that can have an alkyl chain having between 6 to 12 carbon atoms. Exemplary alkyl diacrylate monomers according to the present teachings include 1, 10-decanediol diacrylate (DEDA), 1, 12-dodecanediol diacrylate (DODA), hexanediol diacrylate, and combinations of two or more thereof. Because the $T_g$ of the cured polymeric films made using the ink compositions tends to increase with the decreasing alkyl chain length of the diacrylates, it may be advantageous to include diacrylates having shorter alkyl chain lengths for electronic devices in which a higher $T_g$ is desirable. Another exemplary alkyl diacrylate monomer according to the present teachings is tricyclo[5.2.1.02,6]decanedimethanol diacrylate, which has the following structure:

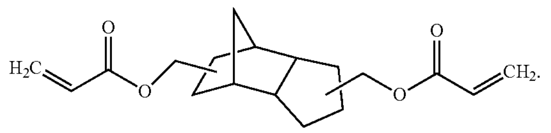

Some embodiments of the curable ink compositions are free of dimethacrylate monomers, while other embodiments include a mixture of dimethacrylate monomers and diacrylate monomers. In various embodiments of the ink compositions that include the diacrylate monomers, the concentration of diacrylate monomers is at least 30 mol. %. By way of illustration, some embodiments of the ink compositions have a diacrylate monomer concentration in the range from 30 mol. % to 40 mol. %, including in the range from 31 mol. % to 37 mol. %.

The diacrylates tend to be more reactive than their dimethacrylate counterparts, and alkyl diacrylates tend to become more reactive with decreasing alkyl chain length. This increased reactivity can result in a faster cure rate for the polymeric films formed from the ink compositions. As discussed below, for certain applications, a fast cure may be undesirable. For such applications, ink compositions that include a mixture of dimethacrylates and diacrylates and/or that include alkyl diacrylates having longer alkyl chains (e.g., alkyl chains of nine or more carbon atoms) may be used. In addition, one or more curing kinetics control additives can be included in the ink compositions in order to reduce their rate of cure.

As the ink compositions cure, they undergo a rapid viscosity increase once the gel point is reached due to bulk network formation and, ultimately, become vitrified. Bulk network formation and vitrification restrict the movement of polymer chain segments and monomer diffusion in the composition. This can lead to high internal stress build up in the curing film, causing significant kinetic instability of the polymer network, low flexibility, as characterized by high elastic modulus (high ratio of Stress/Strain), and/or delamination of the cured film from an underlying substrate. By adding curing kinetics control additives to the curable ink compositions, the rate of curing can be decreased and the time it takes to reach the gel point and/or vitrification can be lengthened. As a result, the stress build-up in the cured polymeric films made from the ink compositions can be reduced to provide a cured film that is more stable, more flexible, or both. The use of curing kinetics control additives may be particularly advantageous for applications and industries where high intensity UV light is routinely used to cure the compositions.

The curing kinetics control additives share the common characteristic that they increase an ink composition's time to reach gel point and/or vitrification onset, relative to that of an ink composition that does not include the curing kinetics control additives, but is otherwise the same ink composition.

However, the curing kinetics control additives can slow the rate of curing and increase the time to gel point and/or vitrification onset via different mechanisms.

In some embodiments of the curable ink compositions, the curing kinetics control additives are curable monomers that have a lower reactivity than the diacrylates and, in some cases the dimethacrylates, during the curing of the ink compositions. Because these additives act as monomers during polymerization, they are referred to as curing kinetics control monomers. Curable monofunctional monomers, including monofunctional vinyl monomers and monofunctional (meth)acrylate monomers, are examples of monomers that may have a lower reactivity during curing than the diacrylate monomers in a curable ink composition. Tert-butyl styrene (TBS) is an example of a vinyl styrene monomer that can be used as a curing kinetics control monomer. The monofunctional (meth)acrylates can be, for example, alkyl monoacrylates and/or alkyl monomethacrylates. Because the reactivity of alkyl mono(meth)acrylates generally increases with decreasing alkyl chain length, suitable alkyl mono(meth)acrylates include those having alkyl chains of at least nine, including at least ten, carbon atoms.

The use of monofunctional acrylates in the ink compositions may also provide the cured polymeric films formed from the ink compositions with a lower elastic modulus and, therefore, a higher flexibility. In fact, monofunctional (meth) acrylates can be added to the curable ink compositions for the purpose of decreasing the elastic modulus of polymeric films formed therefrom even if they do not act as curing kinetics control monomers. Lauryl acrylate is one example of a monofunctional acrylate that can be included in the ink compositions as a curing kinetics controls monomer and to decrease the elastic modulus of the polymeric films formed from the ink compositions.

The curing kinetics control additives can also be chain transfer agents and/or radical trapping agents. Chain transfer agents (CTA), also called modifiers or regulators, have at least one weak chemical bond. These compounds react with the free-radical site of a growing polymer chain and interrupt chain growth. In the process of chain transfer, the radical is temporarily transferred to the chain transfer agent which reinitiates growth by transferring the radical to another polymer or monomer. Such interruption of chain growth followed by radical transfer, and chain growth re-initiation reduces the average molecular weight of growing polymer chains in a polymeric composition, and delays polymer chain propagation throughout the volume. This leads to the formation of microgels (localized network formation) initially, rather than a bulk gelled network as curing process initiated. The result is a delayed gel point and delayed vitrification. Examples of chain transfer agents and/or radical trapping agents that can be used as curing kinetics control additives include thiols, for example, dodecyl thiol; vinyl styrene derivatives, such as α-methyl styrene dimer (MSD) (also known as 2,4-Diphenyl-4-methyl-1-pentene);

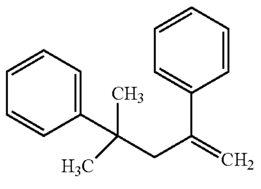 [SMILES: C=C(CC(C)(C)c1ccccc1)c1ccccc1]

and cyclic terpenes, such as terpinolene (also known as 4-Isopropylidene-1-methylcyclohexene, or p-Meth-1-en-8-yl-formate, p-Menth-1,4(8)-diene), dipentene (also known as limonene, or p-Mentha-1,8-diene), and gamma-terpinene (also known as 1-Isopropyl-4-methyl-1,4-cyclohexadiene, or p-Mentha-1,4-diene).

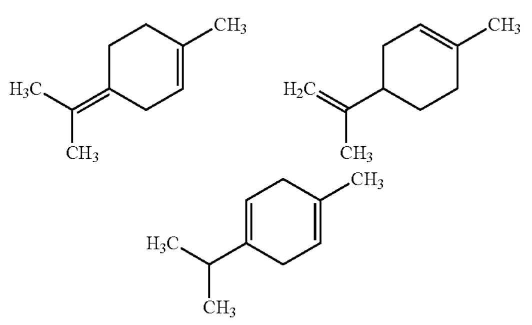

Some embodiments of the ink compositions are free of halogenated hydrocarbon chain transfer agents, as those can have harmful effects on underlying device structures.

The concentration of the curing kinetics control additives in the curable ink compositions will depend, at least in part, on the mechanism by which such additives increase the time to reach the gel point and/or vitrification.

Curing kinetics control monomers increase the vitrification time by lowering reactivity during cure, and can also decrease polymer chain branching when monofunctional monomers are used, thus creating more open polymer network formation. Such monomers usually have a relatively small effect on the gel point, while noticeably delaying vitrification of the forming polymer network. However, when chain transfer agents (CTA) that reduce the average molecular weight of growing polymer chains are used to control curing kinetics, they significantly delay both curing steps: a gel point; and vitrification of the forming polymer network. Delayed gelling of a curable formulation, which means extended time during which an ink formulation remains liquid (non-gelled ink phase), allows for a greater stress release in a pre-forming polymer network (micro gels), resulting in much less stress buildup. A reduction in the average molecular weight of growing polymer chains also results in a slower viscosity increase even after gelling occurs, which allows for slower decrease in diffusion of monomers throughout the forming polymer network, and a higher degree of double bonds conversion. Thus, CTAs can be much more effective at controlling curing kinetics and decreasing the internal stress buildup of a polymer network. They can also provide a more complete photoinitiator consumption due to a longer reaction time, and higher concentrations of forming radicals.

Generally, the concentration of a curing kinetics control monomer that increases the time to reach vitrification simply by virtue of having a lower reactivity during cure, and/or decreased branching, will be in the range from 1 mol. % to 20 mol. %, while the concentration of a curing kinetics control additive that is a chain transfer agent will be less than 1 mol. %. For example, various embodiments of the ink compositions have a curing kinetics control additive concentration in the range from 0.2 mol. % to 5 mol. %; and more typically in the range from 0.2 mol. % to 2.5 mol. %. However, concentrations outside of these ranges can be used.

The degree to which the curing kinetics control additives increase the time to reach the gel point, and the time to vitrification onset (also referred to as the vitrification time) will depend on their particular curing kinetics control mechanism as described above, and their concentration in the ink composition. For some embodiments of the ink compositions, the addition of the curing kinetics control additives increases the time to reach the gel point or the time to reach vitrification by at least 40%. This includes embodiments of the ink compositions for which the addition of the curing kinetics control additives increases the time to reach the gel point or the time to reach vitrification by at least 100% and further includes embodiments of the ink compositions for which the addition of the curing kinetics control additives increases the time to reach the gel point or the time to vitrification by at least 200%. For the purposes of this disclosure, the vitrification time for an ink composition can be measured as the time to reach maximum curing rate for that ink composition, where the maximum in the curing rate corresponds to the peak in a graph of the heat released by the composition during curing as a function of curing time.

A choice of particular curing kinetic control additives will depend on the desired or required properties of the ink compositions and/or the intended method for their application, and on the desired or required properties of the cured polymeric films made from the ink compositions. For example, an ink formulation may be well balanced in terms of its chemical composition for meeting the requirements of an intended application and may have optimal physical properties (for example an optimal viscosity and surface tension for inkjet printing). If the curing kinetics of such a well-balanced composition have to be adjusted to prevent a stress buildup, then it may be advantageous to use CTA curing kinetics control additives, since they are highly efficient even at low quantities. Their low quantity will have a minimal impact on the ink composition's chemical and physical properties but will result in the formation of a polymeric film with reduced stress. Alternatively, if it would be beneficial to incorporate significant quantities of a certain chemical functionalities into an ink composition, then lower reactivity curing kinetic control monomers could be used, optionally in combination with one or more CTAs. For example, if rigid curing kinetics control additives are used, they can provide the additional advantage of increasing the $T_g$ of the polymeric films formed by curing the curable ink compositions. TBS is an example of a rigid curing kinetics control monomer that can be used for this purpose.

In addition to di(meth)acrylate monomers as previously described herein, various multifunctional (meth)acrylate monomer crosslinking agents can be included in the curable ink compositions of the present teachings. As an alternative to, or in addition to, the multifunctional (meth)acrylate crosslinking agents, the curable ink compositions can include one or more multifunctional vinyl siloxane crosslinking agents. As used herein, the term multifunctional crosslinking agent refers to a crosslinking agent having at least three reactive crosslinkable groups. Thus, the multifunctional (meth)acrylate crosslinking agents can be, for example, tri(meth)acrylates, tetra(meth)acrylates, as well as higher functionality (meth)acrylates. For example, curable ink compositions of the present teachings can include trimethylolpropane tri(meth)acrylate and pentaerythritol tetra (meth)acrylate, as well as combinations thereof. Vinyl siloxane crosslinking agents include cyclic vinyl siloxanes, such as 2,4,6,8-tetramethyl-2,4,6,8-tetravinylcyclotetrasiloxane (TMTVCTS). For applications where a flexibility and/or a high $T_g$ is desired, higher functionality crosslinking agents, including crosslinking agents have four or more crosslinkable groups may be used.

Curable ink compositions of the present teachings can include multifunctional crosslinking agents at concentration in the range from, for example, 1 mol. % to 15 mol. %. This includes embodiments of the ink compositions having a multifunctional crosslinking agent concentration in the range from 5 mol. % to 10 mol. %. However, concentrations outside of these ranges can be used. For example, a trimethylolpropane tri(meth)acrylate in a range of between about 1-13 mol. % of a curable ink composition. In various curable ink composition of the present teachings, a pentaerythritol tetra(meth)acrylate monomer can be included in a range of between about 3-10 mol. % of a composition.

A generalized structure of a tri-functional tri(meth)acrylate monomer, trimethylolpropane tri(meth)acrylate, is shown below:

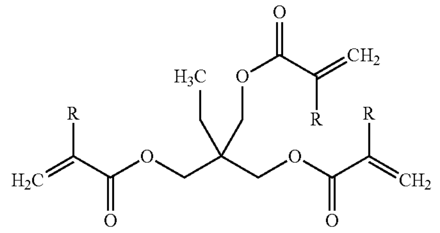

where R is independently selected from H and $CH_3$

An exemplary trimethylolpropane tri(meth)acrylate for various embodiments of a curable ink composition of the present teachings is trimethylolpropane triacrylate, the structure of which is given below:

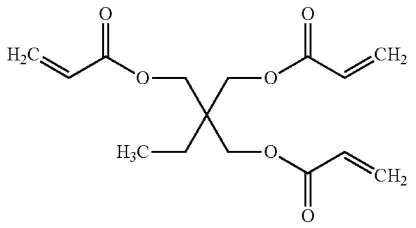 [SMILES: C=CC(=O)OCC(CC)(COC(=O)C=C)COC(=O)C=C]

A generalized structure of a tetra-functional tetra(meth) acrylate monomer, pentaerythritol tetra(meth)acrylate, is shown below:

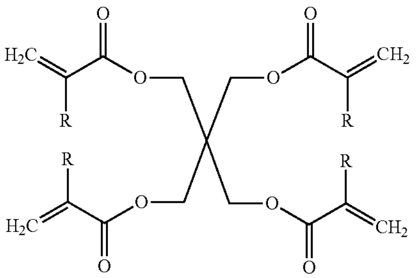

where R is independently selected from H and $CH_3$

An exemplary pentaerythritol tetra(meth)acrylate of the present teachings, pentaerythritol tetraacrylate, is shown below:

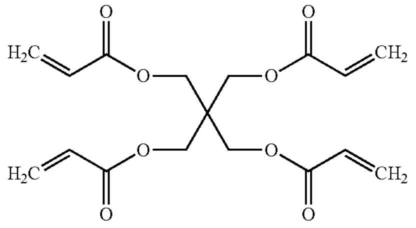 [SMILES: C=CC(=O)OCC(COC(=O)C=C)(COC(=O)C=C)COC(=O)C=C]

With respect to the initiation of the curing process, various embodiments of the curable ink compositions of the present teachings can utilize numerous types of cure initiators for initiating polymerization. Suitable cure initiators include photoinitiators (PIs), thermal initiators, and initiators that induce polymerization using other types of energy, such as electron beam initiators. In some embodiments of the ink compositions, photoinitiators are used. In these embodiments the photoinitiators may be present in amounts in the range from about 1 mol. % to about 10 mol. %. This includes embodiments in which the photoinitiators are present in amounts in the range from about 2 mol. % to about 6 mol. %. However, amounts outside of these ranges can also be used. The photoinitiator may be a Type I or a Type II photoinitiator. Type I photoinitiators undergo radiation-induced cleavage to generate two free radicals, one of which is reactive and initiates polymerization. Type II photoinitiators undergo a radiation-induced conversion into an excited triplet state. The molecules in the excited triplet state then react with molecules in the ground state to produce polymerization initiating radicals.

The specific photoinitiators used for a given curable ink composition are desirably selected such that they are activated at wavelengths that are not damaging to the OLED materials. For this reason, various embodiments of the curable ink compositions include photoinitiators that have a primary absorbance with a peak in the range from about 365 nm to about 420 nm. The light source used to activate the photoinitiators and induce the curing of the curable ink compositions is desirably selected such that the absorbance range of the photoinitiator matches or overlaps with the output of the light source, whereby absorption of the light creates free radicals that initiate polymerization. Suitable light sources may include mercury arc lamps and light emitting diodes.

An acylphosphine oxide photoinitiator can be used, though it is to be understood that a wide variety of photoinitiators can be used. For example, but not limited by, photoinitiators from the α-hydroxyketone, phenylglyoxylate, and α-aminoketone classes of photoinitiators can also be considered. For initiating a free-radical based polymerization, various classes of photoinitiators can have an absorption profile of between about 200 nm to about 400 nm. For various embodiments of the curable ink compositions and methods of printing disclosed herein, 2,4,6-trimethylbenzoyl-diphenylphosphine oxide (TPO) and 2,4,6-trimethylbenzoyl-diphenyl phosphinate have desirable properties. For various embodiments of the curable ink compositions and printing methods of the present teaching, an acylphosphine oxide photoinitiator can be about 0.1-5 mol. % of a formulation. Examples of acylphosphine photoinitiators include Omnirad® TPO (also previously available under the tradename Lucirin® TPO) initiators for curing with optical energy in the wavelength range of about 365 nm to about 420 nm sold under the tradenames Omnirad® TPO, a type I hemolytic initiator which; with absorption @380 nm; Omnirad® TPO-L, a type I photoinitiator that absorbs at 380 nm; and Omnirad® 819 with absorption at 370 nm. By way of non-limiting example, a light source emitting at a nominal wavelength in the range from 350 nm to 395 nm at a radiant energy density of up to 2.0 J/cm$^2$ could be used to cure a curable ink composition comprising a TPO photoinitiator. Using the appropriate energy sources, high levels of curing can be achieved. For example, some embodiments of the cured films have a degree of curing of 90% or greater, as measured by Fourier Transform Infrared (FTIR) spectroscopy.

Tables 1 through 7, shown below, summarize various components, as well as ranges for the components, for four non-limiting exemplary curable ink compositions of the present teachings.

TABLE 1

Summary of composition for Formulation I, including component ranges

| Component | Mol. % (Range) |
|---|---|
| 1,12 Dodecanediol Dimethacrylate (DDMA) | 57-97 |
| Diurethane Dimethacrylate (DUDMA) | 1-20 |
| Trimethylolpropane Triacrylate (TMPTA) | 1-13 |
| Ethyl (2,4,6-trimethylbenzoyl) phenylphosphinate (TPO) | 1-10 |

TABLE 2

Summary of composition for Formulation II, including component ranges.

| Component | Mol. % (Range) |
|---|---|
| 1,12 Dodecanediol Dimethacrylate (DDMA) | 64-97 |
| Pentaerythritol tetraacrylate (PET) | 1-13 |
| Trimethylolpropane Triacrylate (TMPTA) | 1-13 |
| Ethyl (2,4,6-trimethylbenzoyl) phenylphosphinate (TPO) | 1-10 |

TABLE 3

Summary of composition for Formulation III, including component ranges.

| Component | Mol. % (Range) |
|---|---|
| 1,12 Dodecanediol Dimethacrylate (DDMA) | 50-56 |
| 1,10-decanediol diacrylate (DEDA) | 31-37 |
| α-methyl styrene dimer (MSD) | 0.2-5 |
| Trimethylolpropane Triacrylate (TMPTA) | 1-10 |
| Ethyl (2,4,6-trimethylbenzoyl) phenylphosphinate (TPO) | 0.5-5 |

TABLE 4

Summary of composition for Formulation IV, including component ranges.

| Component | Mol. % (Range) |
|---|---|
| 1,12 Dodecanediol Dimethacrylate (DDMA) | 50-56 |
| 1,10-decanediol diacrylate (DEDA) | 31-37 |
| α-methyl styrene dimer (MSD) | 0.2-5 |
| Trimethylolpropane Triacrylate (TMPTA) | 1-10 |
| 2,4,6,8-tetramethyl-2,4,6,8-tetrayinylcyclotetrasiloxane (TMTVCTS) | 0.2-5 |
| Ethyl (2,4,6-trimethylbenzoyl) phenylphosphinate (TPO) | 0.5-5 |

TABLE 5

| Summary of composition for Formulation V, including component ranges. | |
|---|---|
| Component | Mol. % (Range) |
| 1,12 Dodecanediol Dimethacrylate (DDMA) | 50-56 |
| 1,10-decanediol diacrylate (DEDA) | 1-20 |
| Tricyclodecanedimethanol Diacrylate (TCDDA) | 1-20 |
| a-methyl styrene dimer (MSD) | 0.2-5 |
| Trimethylolpropane Triacrylate (TMPTA) | 1-10 |
| Ethyl (2,4,6-trimethylbenzoyl) phenylphosphinate (TPO) | 0.5-5 |

TABLE 6

| Summary of composition for Formulation V1, including component ranges. | |
|---|---|
| Component | Mol. % (Range) |
| 1,12 Dodecanediol Dimethacrylate (DDMA) | 50-56 |
| Tricyclodecanedimethanol Diacrylate (TCDDA) | 5-40 |
| a-methyl styrene dimer (MSD) | 0.2-5 |
| Trimethylol propane Triacrylate (TMPTA) | 1-10 |
| Ethyl (2,4,6-trimethylbenzoyl) phenylphosphinate (TPO) | 0.5-5 |

TABLE 7

| Summary of composition for Formulation VII, including component ranges. | |
|---|---|
| Component | Mol. % (Range) |
| 1,12 Dodecanediol Dimethacrylate (DDMA) | 50-56 |
| Tricyclodecanedimethanol Diacrylate (TCDDA) | 5-40 |
| Trimethylolpropane Triacrylate (TMPTA) | 1-10 |
| Ethyl (2,4,6-trimethylbenzoyl) phenylphosphinate (TPO) | 0.5-5 |

Some embodiments of the curable ink compositions of the present teachings are formulated to provide stability during processing of the formation of a complete encapsulation stack fabricated upon an OLED device, as well as long-term stability for the effective sealing of the device over its useful lifetime. Additionally, curable ink compositions of the present teachings are formulated to provide function, such as flexibility, and optical properties, such as to enhance the use of an OLED device. For example, in Formulations I through IV an alkyl di(meth)acrylate monomer, such as DDMA, in conjunction with a selection of cross-linking agents, such as PET and TMPTA, can provide an organic planarizing layer with a hydrophobic property and high cross-linking density. However, other polymer film properties may also be important for an encapsulation stack or another electronic device, such as providing flexibility for OLEDs and other devices that can be repeatedly bent, rolled, or otherwise flexed. The selection of the types and amounts of components can be done according to the present teachings, to provide for films that are mechanically durable and at the same time flexible. By way of a non-limiting example, in Formulation I, the diurethane di(meth)acrylate monomer, DUDMA, can be used in conjunction with an alkyl di(meth)acrylate monomer in ranges as given in Table 1 to provide for organic encapsulation stacks that have reduced stress and provide for targeted polymer film flexibility. In another non-limiting example, in Formulation II, a mixture of trifunctional and tetra-functional crosslinking agents can be used to provide for mechanical strength and desired degree of polymer crosslinking, and at the same time render sufficient segment mobility within the polymer network to provide for targeted polymer film flexibility.

Properties of liquid curable ink compositions that can be tailored to meet the requirements of a given device application include viscosity, surface tension and water content. A summary of viscosity, surface tension and water content determinations for Formulation I and Formulation II is given in Table 5 below:

TABLE 5

| Properties of exemplary organic polymer formulations | | | |
|---|---|---|---|
| Composition ID | Viscosity ± SD (cP at 25° C.) | Surface Tension ± SD (Dynes/cm at 25° C.) | Water (ppm) ± SD |
| Formulation I | 25.6 ± 0.47 (N = 10) | 38.9 ± 0.21 (N = 10) | 73 ± 26 (N = 10) |
| Formulation II | 16.09 ± 0.30 (N = 8) | 37.7 ± 0.20 (N = 8) | 36 ± 9 (N = 8) |

With respect to properties of curable ink compositions of the present teachings, generally, for use for inkjet printing applications, the surface tension, viscosity and wetting properties of the curable ink compositions should be tailored to allow the compositions to be dispensed through an inkjet printing nozzle without drying onto or clogging the nozzle at the temperature used for printing (e.g., room temperature; ca. 25° C.). Once formulated, various embodiments of the curable ink compositions can have a viscosity of between about 10 cP and about 28 cP (including, for example, between about 15 cP and about 26 cP) at 25° C. and a surface tension of between about 28 dynes/cm and about 45 dynes/cm at 25° C. As will be discussed in more detail herein, it is desirable to keep the water content as determined by the Karl Fischer titrimetric method to less than 100 ppm, which as shown in Table 5 was readily met in analysis of Formulation I and Formulation II.

Figure 2:
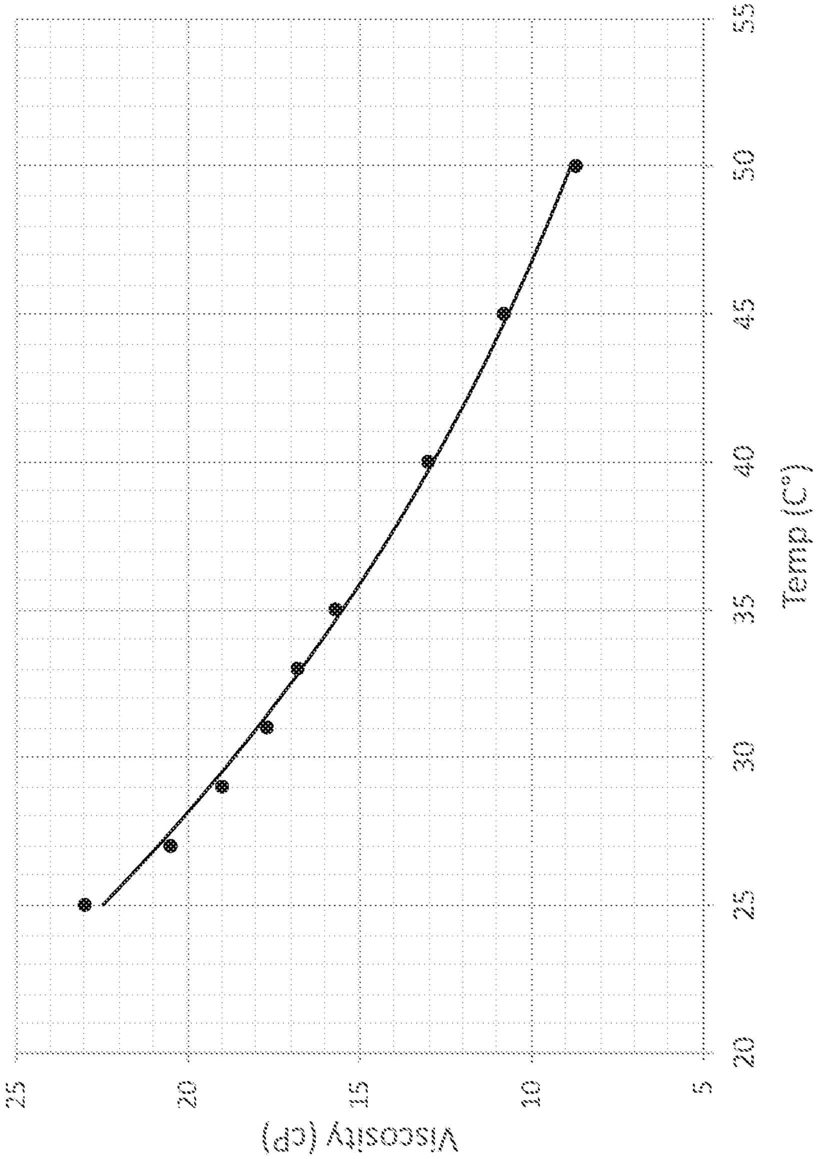
FIG. 2 is a graph of viscosity versus temperature for various embodiments of a first organic monomer composition of the present teachings.
Figure 3:
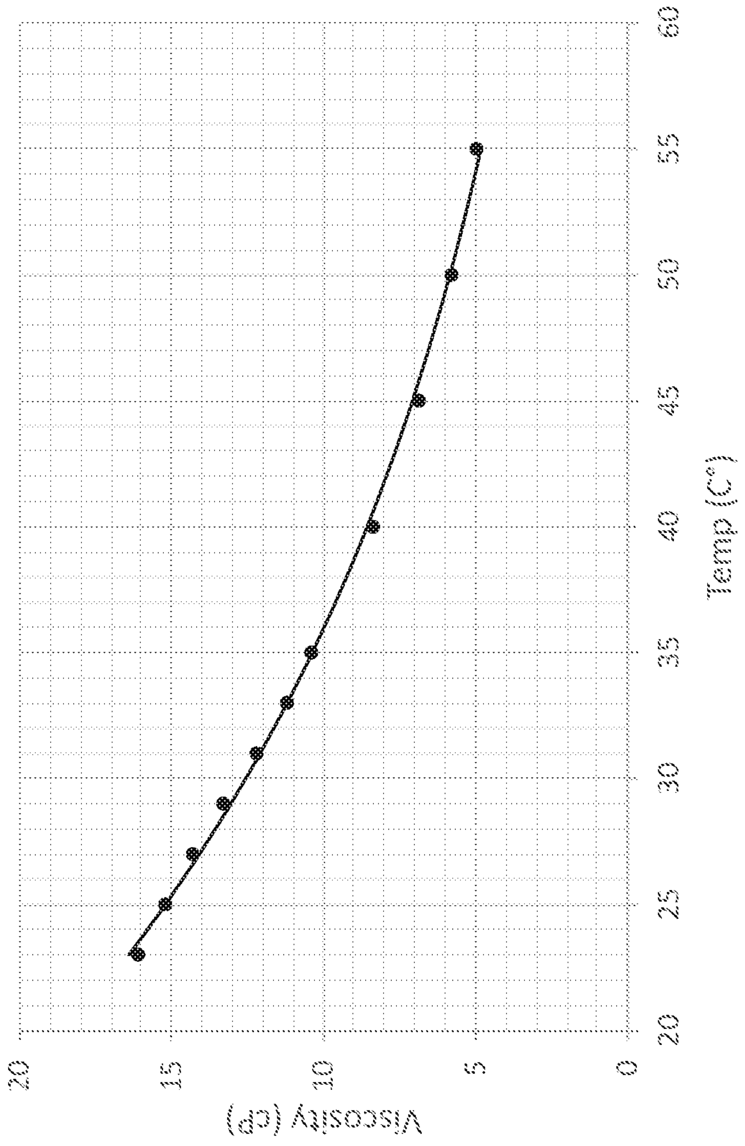
FIG. 3 is a graph of viscosity as a function of temperature for various embodiments of a second organic monomer composition of the present teachings.

FIG. 2 illustrates generally a graph of viscosity as a function of temperature for Formulation I, while FIG. 3 illustrates generally a graph of viscosity as a function of temperature for Formulation II. Jetting temperatures can be between about 20° C. to about 50° C., including temperatures between 22° C. to about 40° C. As can be seen by inspection of the graphs presented in FIG. 2 and FIG. 3, over such temperature ranges, various embodiments of organic polymer formulations can have a viscosity of between about 7-25 cP; including, for example, between about 9 cP and about 19 cP.

Preparation, Drying and Storage of Curable Ink Compositions

Given that the initiation of polymerization can be induced by light, curable ink compositions can be prepared to prevent exposure to light. With respect to the preparation of the curable ink compositions of the present teachings, in order to ensure the stability of various compositions, the compositions can be prepared in a dark or very dimly lit room or in a facility in which the lighting is controlled to exclude wavelengths that would induce polymerization. Such wavelengths generally include those below about 500 nm. For example, for the preparation of an embodiment of an organic polymer formulation, in a fashion that protects the direct exposure to light, the lid of a clean amber vial (for example, Falcons, VWR trace clean) can be removed and then can be placed on a balance; and tared. First, a desired amount of a photoinitiator can be weighed into the vial. Then, the dimethacrylate and/or diacrylate can be weighed into the vial. Next, the mono(meth)acrylate monomer can be weighed into the vial. Finally, the crosslinking agent can be weighed into the vial. (The preceding description lays out one protocol for sequentially incorporating the various components into a curable ink composition. Other protocols can be used.) Regarding mixing to provide uniform concentration of components, a Teflon® coated magnetic stir bar can be inserted into the vial and the cap of vial secured. The solution can then be stirred, for example, for 30 minutes at temperatures in the range from room temperature to 50° C. and 600-1000 rpm.

Once the curable ink compositions are prepared, they can be dehydrated by mixing in the presence of a 10 wt. % 3A molecular sieve beads for a period of several hours or more to yield <100 ppm moisture and then stored under a dry, inert atmosphere, such as a compressed dry air atmosphere. Thereafter, the curable ink composition can be filtered, for example, through a 0.1 am or 0.45 am PTFE syringe filter or vacuum or pressure filter, followed by sonication for 30 minutes at ambient temperature to remove residual gases. The curable ink composition is then ready for use and should be stored away in a dark cool environment. Various embodiments of an organic thin film organic polymer preparation as described can have a viscosity of between about 10 cps and about 30 cP at 22° C. and a surface tension of between about 34 dynes/cm and about 40 dynes/cm at 22° C.

The curable ink compositions, particularly those stored under a dry, inert atmosphere at room temperature (22° C.), can be stable for long periods of time, as determined by the lack of precipitation or gelation under visual inspection and the stabilities in their room temperature viscosities and surface tensions. No significant changes were recorded in viscosity and surface tension of the curable ink compositions of Formulations I and II; any changes are deemed to be within measurement errors for at least 160 days at room temperature under compressed dry air atmosphere in the dark.

Properties of Thin Films Formed Using Exemplary Formulations

After curing, continuous polymeric films having thicknesses of between about 2 am to about 10 am were successfully fabricated on various substrates using Formulation I and Formulation II. Film properties including percent volume shrinkage, degree of curing, optical haze, optical transmission and color were evaluated for films formed using Formulation I and Formulation II. The results of the evaluation of such properties for Formulation I and Formulation II are presented in Table 6 and Table 7, shown below, as well as in FIG. 5.

TABLE 6

Summary of selected properties of films formed from exemplary formulations.

| Composition | Shrinkage (%) ± SD (N = 3) | Curing Degree (%) ± SD (N = 3) | Haze % ± SD (N = 3)[1] |
|---|---|---|---|
| Formulation I | 9.55 ± 0.09 | 87.90 ± 0.12 | 0.033 ± 0.005 |
| Formulation II | 9.93 ± 0.29 | 87.70 ± 0.03 | 0.043 ± 0.005 |

[1]compared to glass reference of 0.083 ± 0.005

TABLE 7

Summary of Lab color space properties of films formed from exemplary formulations.

| | Film from Formulation I | | Film from Formulation II | | Glass Reference | |
|---|---|---|---|---|---|---|
| Source Attribute | Mean (N = 3) | Std. Dev. | Mean (N = 3) | Std. Dev. | Mean (N = 3) | Std. Dev. |
| L* | 96.83 | 0 | 96.83 | 0 | 96.93 | 0 |
| a* | −0.013 | 0 | 0.003 | 0 | 0.003 | 0 |
| b* | 0.32 | 0.01 | 0.33 | 0.01 | 0.15 | 0.005 |

In Table 6, film shrinkage is evaluated using a UV rheometer designed to follow the curing progress from onset of irradiation of the sample to a fully cured state, and the degree of curing is determined using FTIR analysis. For polymeric planarization films from curable ink compositions of the present teachings, shrinkage of less than about 12% and degree of curing of between about 85%-90% are target values for those properties.

Figure 4:
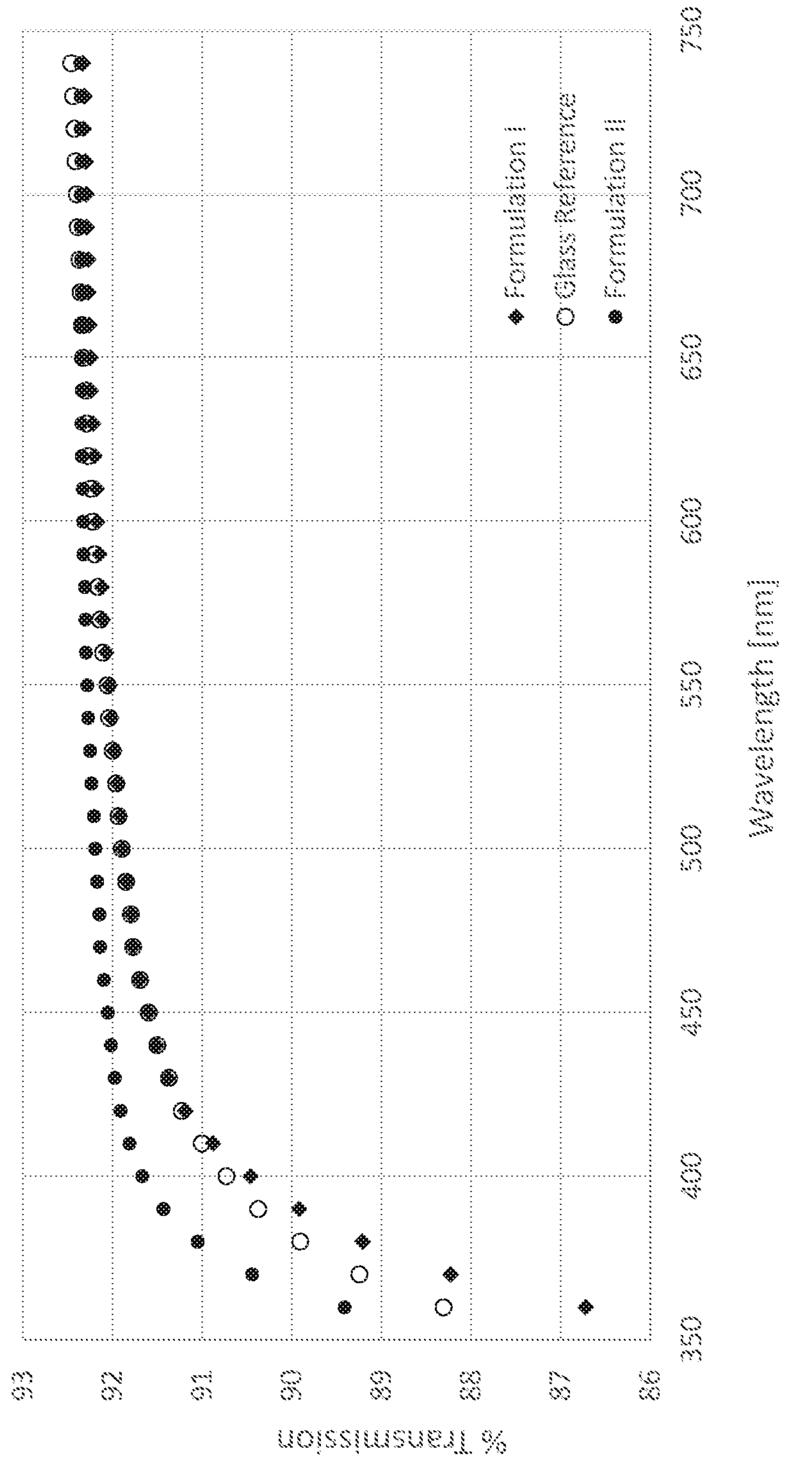
FIG. 4 is a graph of transmission as a function of wavelength for thin films formed from an exemplary composition of the present teachings in comparison to the transmission of a glass reference material.

Optical properties of films formed from curable ink composition of the present teachings for various OLED devices include haze, percent optical transmission through a desired wavelength range, and color. As haze is a measure of the fraction of transmitted wide angle scattered light from a source that is transmitted through a film, a low percent haze is desirable for a polymeric planarizing layer. As such, a target for haze not to exceed 0.10% is clearly met by films formed from Formulation I and Formulation II. As can be seen in the graph presented in FIG. 4, the percent transmission of light in a wavelength range of between about 350 nm to about 750 nm for films formed from Formulation I and Formulation II is comparable to that of a glass reference. Finally, regarding color, it is desirable for films formed from Formulation I and Formulation II not to act as a color filter. Color space as defined by CIELAB, defines a value of L*=100 as the brightness of the object measured, while a* is a measure of chromaticity of red and green, and b is a measure of the chromaticity of yellow and blue. In that regard, for films formed from Formulation I and Formulation II, it is desirable for L* to be greater 95, while it is desirable for a* and b* to be less than 0.5. In that regard, as can be seen by inspection of Table 7, the analysis of representative films formed using Formulation I and Formulation II do not exceed these values, which is consistent with the optical transmission graph shown in FIG. 4.

Systems and Methods for Organic Thin Film Formation on a Substrate

Various embodiments of formulations of the present teachings can be printed using an industrial inkjet printing system that can be housed in an enclosure defining an interior that has a controlled process environment. For example, a controlled process environment of the present teachings can include a process environment that is non-reactive to materials that are used in the fabrication of, for example, various OLED devices, as well as being a substantially low-particle process environment. Patterned printing of an organic thin film on an OLED device substrate in such a controlled environment can provide for high-volume, high yield processes for a variety of OLED devices, such as OLED display and lighting devices.

Curable ink compositions of the present teachings can be printed using a printing system, such as described in U.S. Pat. No. 9,343,678, issued May 17, 2016, which is incorporated herein in its entirety. Various embodiments of the present organic polymer compositions can be inkjet printed into thin films that are continuous and have well-defined edges on such substrates as glass, plastics, silicon, and silicon nitride. For example, the organic polymer compositions can be used to print thin films having thicknesses in the range from about 2 am to about 10 am, or thicker, including thin films having thicknesses in the range from about 2 am to about 8 am. These thin films can be achieved with film thickness variation of, for example, 5% or lower.

Figure 5:
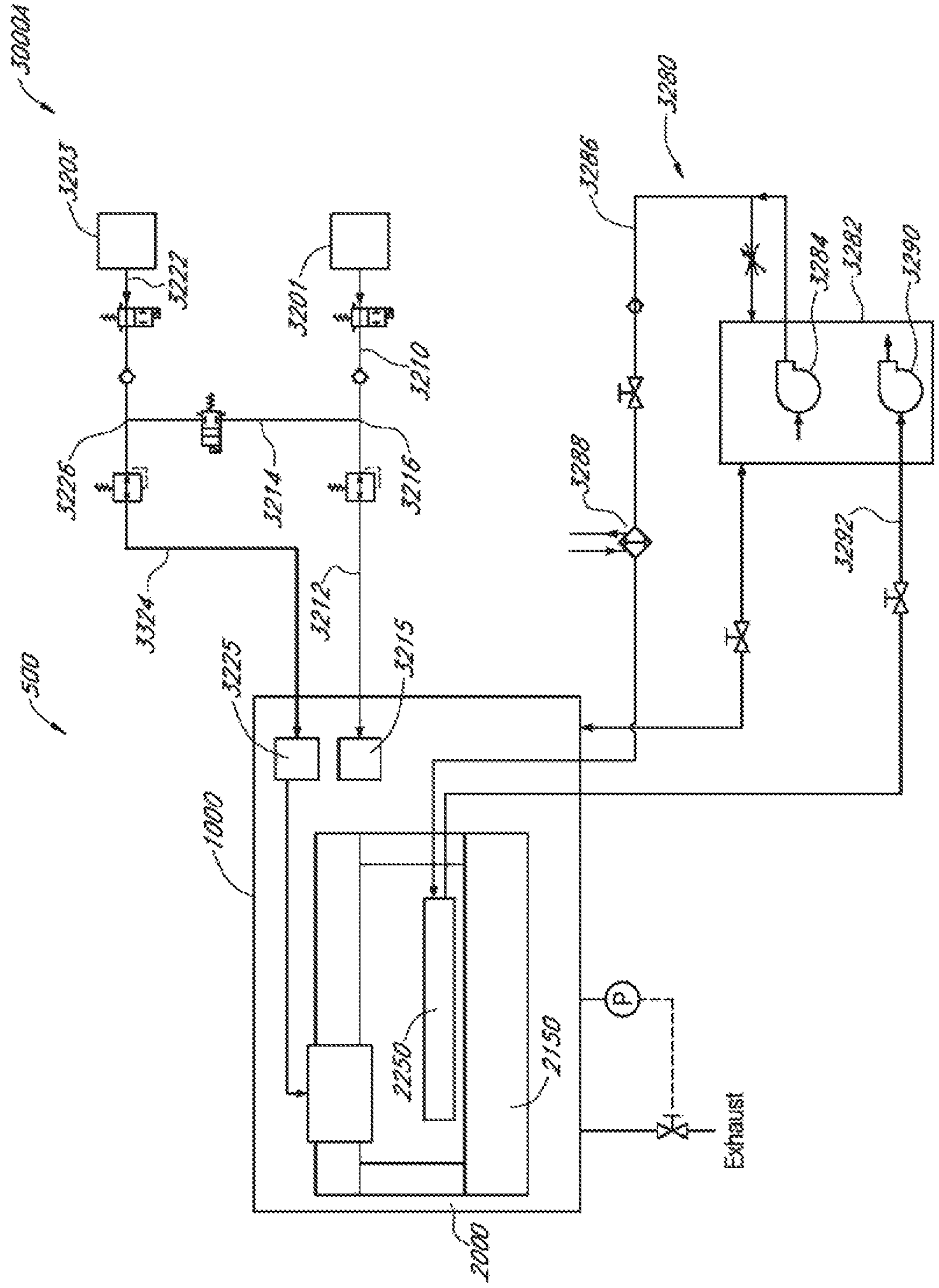
FIG. 5 illustrates generally examples of a gas enclosure system for integrating and controlling gas sources such as can be used to establish a controlled process environment, as well as providing a pressurized gas and at least partial vacuum for use with a floatation table.

Gas enclosure system 500 of FIG. 5 can include gas enclosure 1000 for housing printing system 2000. Printing system 2000 can be supported by printing system base 2150, which can be a granite stage. Printing system base 2150 can support a substrate support apparatus, such as a chuck, for example, but not limited by, a vacuum chuck, a substrate floatation chuck having pressure ports, and a substrate floatation chuck having vacuum and pressure ports. In various examples of the present teachings, a substrate support apparatus can be a substrate floatation table, such as substrate floatation table 2250. Substrate floatation table 2250 can be used to float a substrate during frictionless transport of the substrate. In addition to a low-particle generating floatation table, for frictionless Y-axis conveyance of a substrate, printing system 2000 can have a Y-axis motion system utilizing air bushings.

FIG. 5 illustrates generally an example of gas enclosure system 500 of manufacturing system 3000A configured with external gas loop 3200 for integrating and controlling gas sources, such as a source of CDA and a source of a non-reactive gas such as can be used to establish a controlled process environment for various enclosed manufacturing systems of the present teachings, as well as providing a source of gas for operating various pneumatically controlled devices. According to the present teachings, a non-reactive gas can be any gas that does not undergo a chemical reaction with materials used in the manufacture of OLED devices, such as display and lighting devices, under process conditions. In various embodiments, a non-reactive gas can be a non-oxidizing gas. Some non-limiting examples of non-reactive gas that can be used include nitrogen, any of the noble gases, and any combination thereof. As will be discussed in more detail herein blower loop 3280 can provide pressurized gas and at least partial vacuum for use with a floatation table 2250. Additionally, as depicted in FIG. 5, gas enclosure system 500 can be generally configured so that a pressure of gas inside the gas enclosure 1000 can be maintained within a desired or specified range, such as using a valve coupled to a pressure monitor, P.

Gas enclosure system 500 can also be configured with various embodiments of a gas purification system that can be configured for purifying various reactive species from a non-reactive process gas. A gas purification system according to the present teachings can maintain levels for each species of various reactive species, such as water vapor, oxygen, ozone, as well as organic solvent vapors, for example, at 100 ppm or lower, at 10 ppm or lower, at 1.0 ppm or lower, or at 0.1 ppm or lower. Gas enclosure system 500 can also be configured with various embodiments of a circulation and filtration system for maintaining a substantially particle free environment. Various embodiments of a particle filtration system can maintain a low particle environment within a gas enclosure meeting the standards of International Standards Organization Standard (ISO) 14644-1:1999, "Cleanrooms and associated controlled environments—Part 1: Classification of air cleanliness," as specified by Class 1 through Class 5.

Substrate floatation table is depicted in FIG. 5 as being in flow communication with blower loop 3280. Blower loop 3280 can include blower housing 3282, which can enclose first blower 3284 for supplying a pressurized source of gas to substrate floatation table 2250 via line 3286, and second blower 3290, acting as a vacuum source for substrate floatation table 2250 via line 3292, providing at least partial vacuum to substrate floatation table 2250. Various embodiments of blower loop 3280 can be, configured with heat exchanger 3288 for maintaining gas from blower loop 3280 to substrate floatation table 2250 at a defined temperature.

As depicted in FIG. 5, non-reactive gas source 3201 can be in flow communication with low consumption manifold line 3212 via non-reactive gas line 3210. Low consumption manifold line 3212 is shown in flow communication with low consumption manifold 3215. Cross-line 3214 extends from a first flow juncture 3216, which is located at the intersection of non-reactive gas line 3210, low consumption manifold line 3212, and cross-line 3214. Cross-line 3214 extends to a second flow juncture 3226. CDA line 3222 extends from a CDA source 3203 and continues as high consumption manifold line 3224, which is in fluid communication with high consumption manifold 3225. As will be discussed in more detail herein, CDA can be used during, for example, maintenance procedures. During processing, non-reactive gas source 3201 can be in flow communication with low consumption manifold 3215 and high consumption manifold 3225. As such, during processing non-reactive gas source can be routed through external gas loop 3200 to provide non-reactive gas to gas enclosure 1000, as well as providing non-reactive gas for operating various pneumatically operated apparatuses and devices used during the operation of printing system 2000. For example, high consumption manifold 3225 can provide non-reactive gas from gas source 3201 during processing for the operation of various components for printing system 2000 housed in gas enclosure 1000, such as, but not limited by, one or more of a pneumatic robot, a substrate floatation table, an air bearing, an air bushing, a compressed gas tool, a pneumatic actuator, and combinations thereof.

Regarding the use of CDA, for example, during a maintenance procedure, second flow juncture 3226 is positioned at the intersection of a cross-line 3214, clean dry air line 3222, and high consumption manifold line 3224, which is in flow communication with high consumption manifold 3225. Cross-line 3214 extends from a first flow juncture 3216, which is in flow communication with non-reactive gas line 3210, which flow communication can be controlled by valve 3208. During a maintenance procedure, valve 3208 can be closed to prevent flow communication between non-reactive gas source 3201 and high consumption manifold 3225, while valve 3206 can be opened thereby allowing flow communication between CDA source 3203 and high consumption manifold 3225. Under such conditions, various components that are high consumption can be supplied CDA during maintenance.

With respect to controlling the pressure of gas inside the gas enclosure 1000, as depicted in FIG. 5, such regulation can assist in maintaining a slight positive internal pressure of a gas enclosure system, which can be between about 2-12 mbar above the pressure in the environment external a gas enclosure. Maintaining the internal pressure of a gas enclosure at a desired slightly positive pressure versus an external pressure is necessary given that pressurized gas is also contemporaneously introduced into the gas enclosure system. Variable demand of various devices and apparatuses can create an irregular pressure profile for various gas enclosure assemblies and systems of the present teachings. The internal pressure of a gas enclosure can be maintained within a desired or specified range, by using a control system configured with a valve coupled to a pressure monitor, P, where the valve allows gas to be exhausted to another enclosure, system, or a region surrounding the gas enclosure 1000 using information obtained from the pressure monitor. Exhausted gas can be recovered and re-processed through gas circulation and purification systems as previously described herein.

Figure 6:
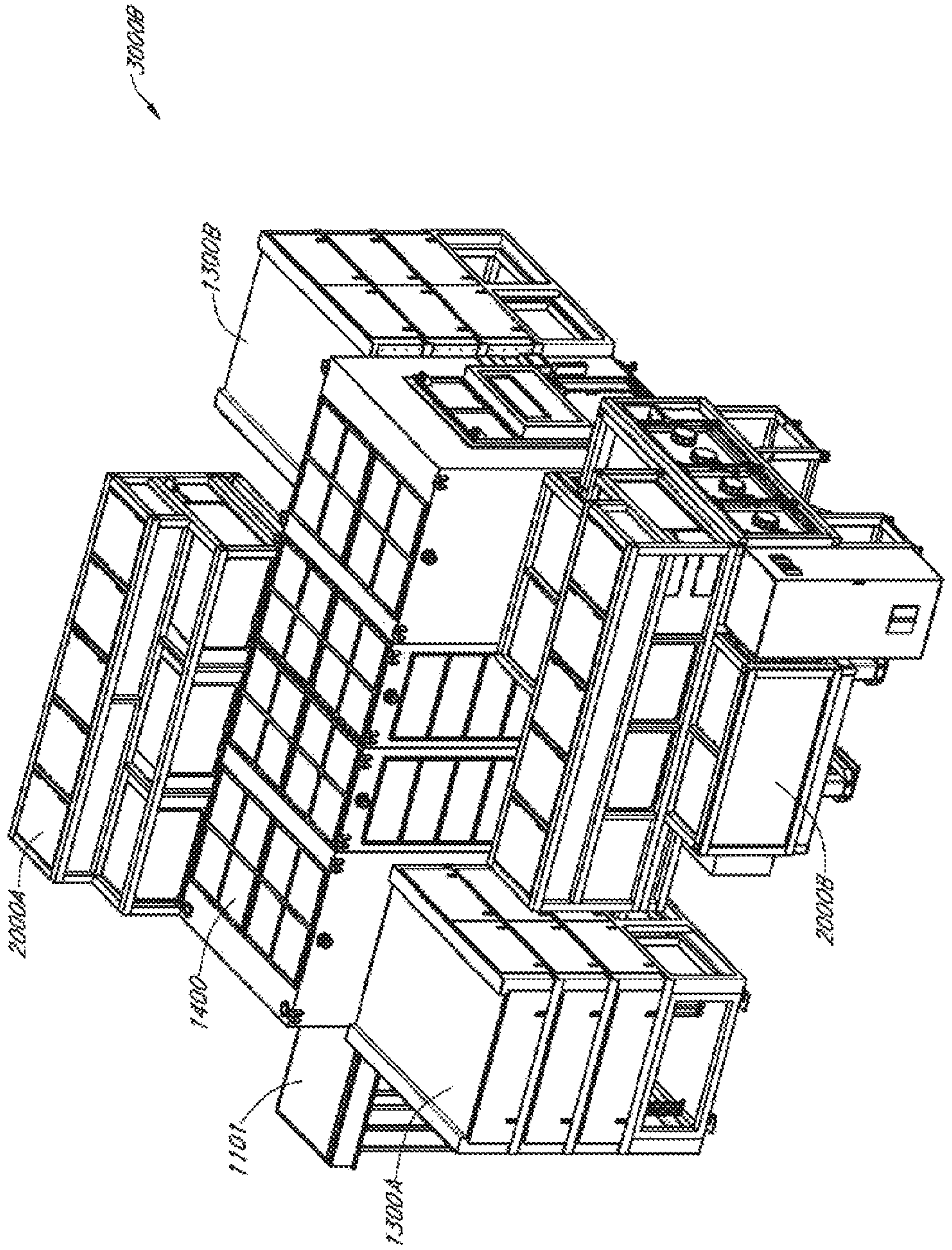
FIG. 6 illustrates generally an isometric view of at least a portion of a system, such as including an enclosed printing system and an enclosed curing system.

FIG. 6 illustrates generally an isometric view of a manufacturing system 3000B, such as including a first printing system 2000A, a second printing system 2000B and first curing system 1300A and second curing system 1300B as well other enclosed modules, that can be used in manufacturing various optoelectronic devices (e.g., an organic light emitting diode (OLED) device). First and second curing systems 1300A and 1300B of the present teachings can be used for one or more of holding a substrate (e.g., to facilitate flowing or dispersing the deposited material layer, such as to achieve a more planar or uniform film), as well as curing (e.g. via optical illumination in wavelength a wavelength range of about 365 nm to about 420 nm) a layer of material, such as deposited by one or more of the first or second printing systems 2000A and 2000B. For example, a material layer that flows or disperses, or is cured, using the first and second processing systems 1300A and 1300B can include a portion of an encapsulation stack (such as a thin film layer comprising an organic thin film material that can cured or treated via exposure to optical energy). The first or second processing systems 1300A or 1300B can be configured for holding substrates, such as in a stacked configuration. The first and second printers 2000A and 2000B can be used, for example, to deposit the same layers on a substrate or printers 2000A and 2000B can be used to deposit different layers on a substrate.

Manufacturing system 3000B can include an input or output module 1101 (e.g., a "loading module"), such as can be used as a load-lock or otherwise in a manner that allows transfer of a substrate into or out of an interior of one or more chambers of manufacturing system 3000B in a manner that substantially avoids disruption of a controlled environment maintained within one or more enclosures of manufacturing system 3000B. For example, in relation to FIG. 6, "substantially avoids disruption" can refer to avoiding raising a concentration of a reactive species by a specified amount, such as avoiding raising such a species by more than 10 parts per million, 100 parts per million, or 1000 parts per million within the one or more enclosures during or after a transfer operation of a substrate into or out the one or more enclosures. A transfer module, such as can include a handler, can be used to manipulate a substrate before, during, or after various operations.

Various examples described herein include enclosed processing systems that can be environmentally-controlled. Enclosure assemblies and corresponding support equipment can be referred to as a "gas enclosure system" and such enclosure assemblies can be constructed in a contoured fashion that reduces or minimizes an internal volume of a gas enclosure assembly, and at the same time provides a working volume for accommodating various footprints of a manufacturing system of the present teachings, such as the deposition (e.g., printing), holding, loading, curing systems or modules described herein. For example, a contoured gas enclosure assembly according to the present teachings can have a gas enclosure volume of between about 6 $m^3$ to about 95 $m^3$ for various examples of a gas enclosure assembly of the present teachings covering, for example, substrate sizes from Gen 3.5 to Gen 10. Various examples of a contoured gas enclosure assembly according to the present teachings can have a gas enclosure volume of, for example, but not limited by, of between about 15 $m^3$ to about 30 $m^3$, which might be useful for printing of, for example, Gen 5.5 to Gen 8.5 substrate sizes above, or other substrate sizes that can readily be derived therefrom.

Figure 7:
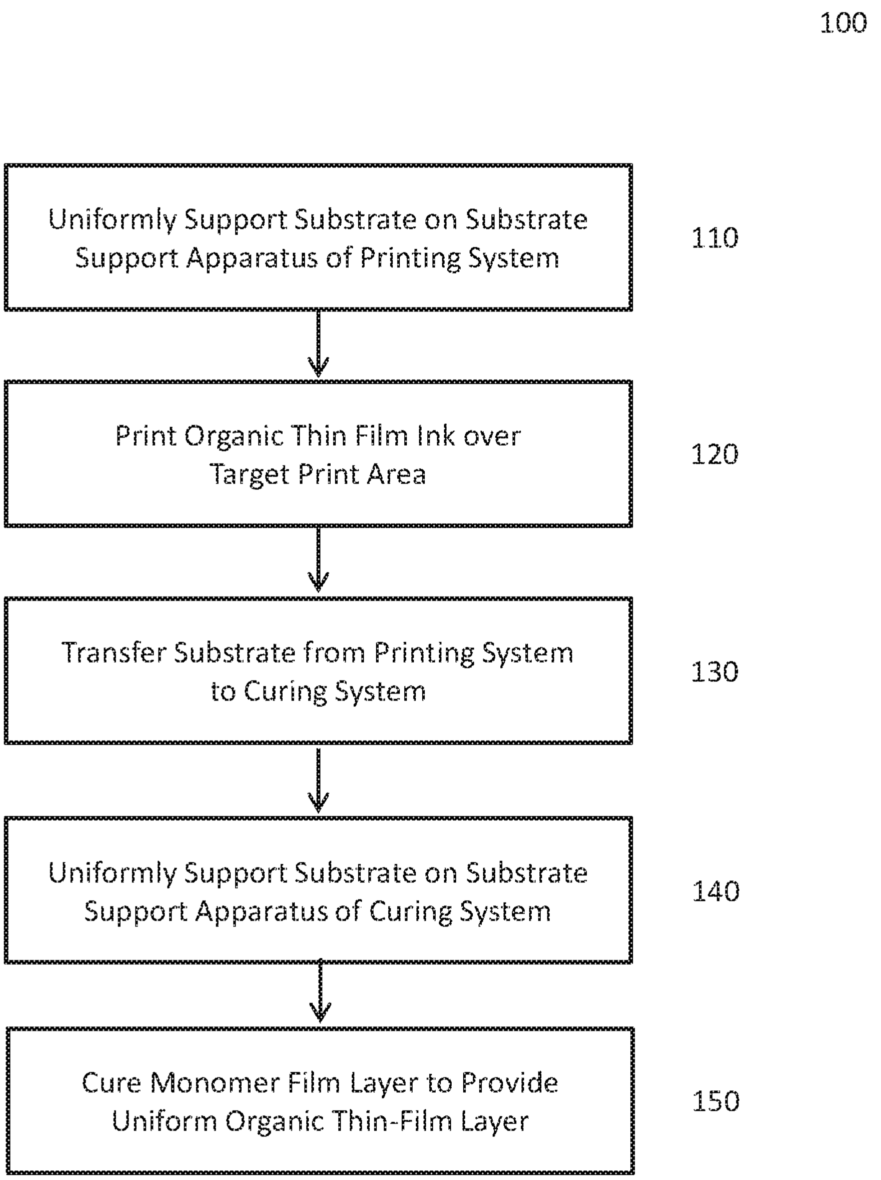
FIG. 7 is a flow diagram that illustrates generally a process for the fabrication of an organic thin films on various device substrates.

FIG. 7 depicts flow diagram 100 that illustrates generally a process for the fabrication of an organic thin films on various device substrates. FIG. 7 illustrates techniques, such as methods, that can include forming an organic thin-film planarizing layer over the active area a light emitting device (e.g., an of a OLED lighting or display device) formed on a substrate, such as for providing a mura-free organic thin film layer. At 110, a substrate can be transferred onto a substrate support system of an enclosed printing system configured to provide a controlled process environment as previously described herein. A substrate can be transferred to an enclosed printing system from, for example, an inorganic thin film encapsulation system. As previously described herein, a substrate support system can be configured to provide uniform support of the substrate at least in one or more active regions of the substrate. Such a substrate support system can include a floatation table configuration, such as having various floatation control zones including one or more of a pneumatically-supplied gas cushion, or a combination of pneumatic and at least partial vacuum supplied regions to provide a gas cushion supporting the substrate. At 120, a curable ink composition can be printed over a target deposition region of a substrate. At 130, the substrate can be transferred from an enclosed printing system to an enclosed curing system configured to provide a controlled process environment as previously described herein. According to the present teachings, for example, a curing system can provide an apparatus that can uniformly illuminate a substrate or portion or a substrate with optical energy in a wavelength range from about 365 nm to about 420 nm. At 140, a curing system can have a substrate support system that can provide a pneumatically supplied gas cushion, or a combination of pneumatic and at least partial vacuum supplied regions to provide a gas cushion supporting the substrate uniformly in a manner that can suppress or inhibit mura formation during one or more of a holding operation or curing operation. For example, the substrate can be held for a specified duration after printing and before curing, such as before an optical curing process is initiated. At 150, the liquid organic polymer layer can be cured, for example, using an optical treatment provided within an enclosed curing system, such as to provide a mura-free organic thin film encapsulation layer.

The present teachings are intended to be illustrative, and not restrictive. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A cured film comprising a polymerization product of: a diacrylate monomer; a curing kinetics control additive; a multifunctional crosslinking agent, and a dimethacrylate monomer, wherein the polymerization product comprises:

the dimethacrylate monomer at a concentration in the range from 50 mole percent to 56 mole percent;

the diacrylate monomer at a concentration in the range from 31 mole percent to 37 mole percent;

the curing kinetics control additive at a concentration in the range from 0.2 mole percent to five mole percent; and the multifunctional crosslinking agent at a concentration in the range from five mole percent to ten mole percent.

2. The film of claim 1, wherein the dimethacrylate monomer comprises 1, 12 dodecanediol dimethacrylate.

3. The film of claim 1, wherein the diacrylate monomer comprises tricyclo[5.2.1.0 2,6]decanedimethanol diacrylate.

4. The film of claim 1, wherein the diacrylate monomer comprises decanediol diacrylate, dodecanediol diacrylate, or a mixture thereof.

5. The film of claim 1, wherein the curing kinetics control additive comprises a chain transfer agent.

6. The film of claim 1, wherein the curing kinetics control additive comprises a styrene monomer.

7. The film of claim 6, wherein the styrene monomer is an a-methylstyrene dimer.

8. The film of claim 1, wherein the curing kinetics control additive comprises a mono(meth)acrylate.

9. The film of claim 8, wherein the mono(meth)acrylate is lauryl acrylate.

10. The film of claim 1, wherein the curing kinetics control additive comprises dodecyl thiol.

11. The composition of claim 1, wherein the multifunctional crosslinking agent comprises a multifunctional (meth) acrylate.

12. The film of claim 11, wherein the multifunctional (meth)acrylate is trimethylolpropane triacrylate.

13. The film of claim 1, wherein the multifunctional crosslinking agent comprises a multifunctional vinyl siloxane.

14. The film of claim 13, wherein the multifunctional vinyl siloxane is 2,4,6,8-tetramethyl-2,4,6,8-tetravinylcylcotetrasiloxane.

15. The film of claim 1, having a Tg of at least 80° C.

16. An encapsulated electronic device comprising:

an electronic device; and the film of claim 1 disposed on a substrate of the electronic device.

17. The electronic device of claim 16, wherein the electronic device is an optoelectronic device.

18. The electronic device of claim 17, wherein the optoelectronic device is an organic light emitting diode.

19. The electronic device of claim 16, wherein the substrate is an inorganic barrier layer.

* * * * *